US005566076A

United States Patent [19]
Kuroda

[11] Patent Number: 5,566,076
[45] Date of Patent: Oct. 15, 1996

[54] SEMICONDUCTOR PROCESS SYSTEM AND POSITIONING METHOD AND APPARATUS FOR TRANSFER MECHANISM THEREOF

[75] Inventor: Kouki Kuroda, Kurume, Japan

[73] Assignees: Tokyo Electron Limited, Tokyo; Tokyo Electron Kyushu Limited, Tosu, both of Japan

[21] Appl. No.: 286,173

[22] Filed: Aug. 5, 1994

[30] Foreign Application Priority Data

Aug. 5, 1993 [JP] Japan .................................. 5-214878

[51] Int. Cl.$^6$ .................................................. G06F 19/00
[52] U.S. Cl. ................................ 364/478.01; 364/167.01
[58] Field of Search ..................................... 364/468, 469, 364/472, 478, 167.01

[56] References Cited

U.S. PATENT DOCUMENTS

| | | | |
|---|---|---|---|
| 5,164,905 | 11/1992 | Iwasaki et al. | 364/468 |
| 5,220,935 | 6/1993 | Bailey et al. | 134/102.1 |
| 5,263,504 | 11/1993 | Bailey et al. | 134/176 |
| 5,329,732 | 7/1994 | Karlsrud et al. | 51/131.5 |

*Primary Examiner*—Paul P. Gordon
*Attorney, Agent, or Firm*—Oblon, Spivak, McClelland, Maier & Neustadt, P.C.

[57] ABSTRACT

A semiconductor wafer cleaning system includes a chemical cleaning section having a process vessel. A holder is arranged in the process vessel. The holder holds 50 wafers at once. Fifty grooves for receiving peripheral portions of wafers are formed on the holder. Fifty wafers are passed/ received all together by a chuck having a pair of opening/ closing arms to/from the holder. Fifty grooves for receiving peripheral portions of wafers are formed on each arm. A positioning apparatus is used to correct the offset of the relative position between the chuck and the holder from a reference relative position for transfer of wafers. The positioning apparatus has a detection unit which can be mounted on the chuck and has image pickup sections on two end portions. Each image pickup section simultaneously images a groove on the chuck and a corresponding groove on the holder. The resultant images of the two grooves are displayed within the same coordinate system on a monitor to be superposed on each other. The chuck and the holder are relatively moved to correct the offset between the images of the two grooves, thereby correcting the offset of the current relative position from the reference relative position.

21 Claims, 9 Drawing Sheets

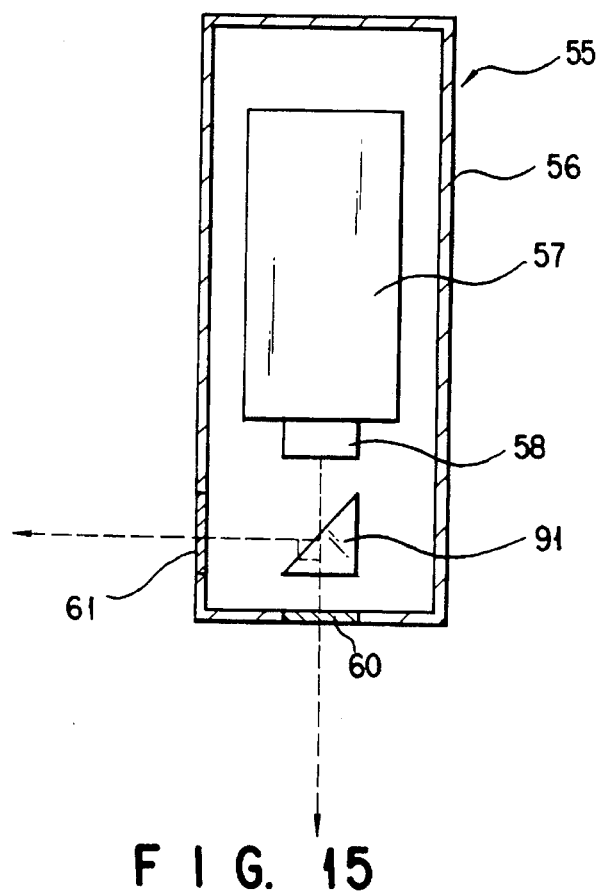
F I G. 15
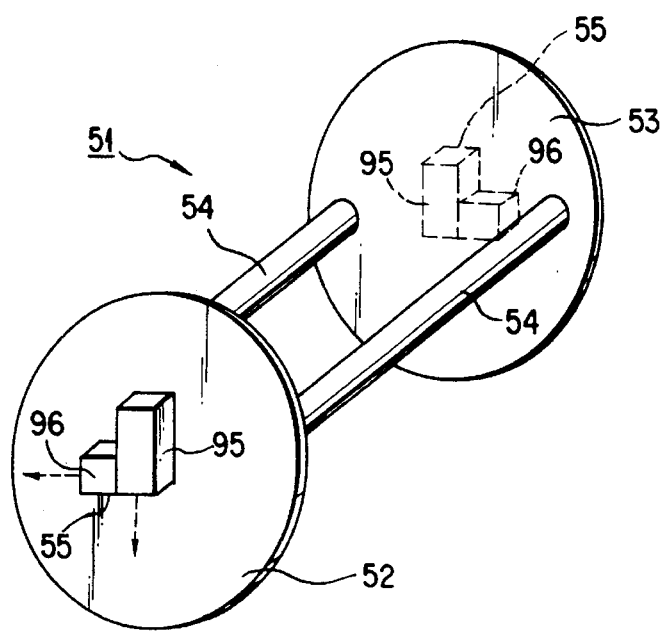
F I G. 16

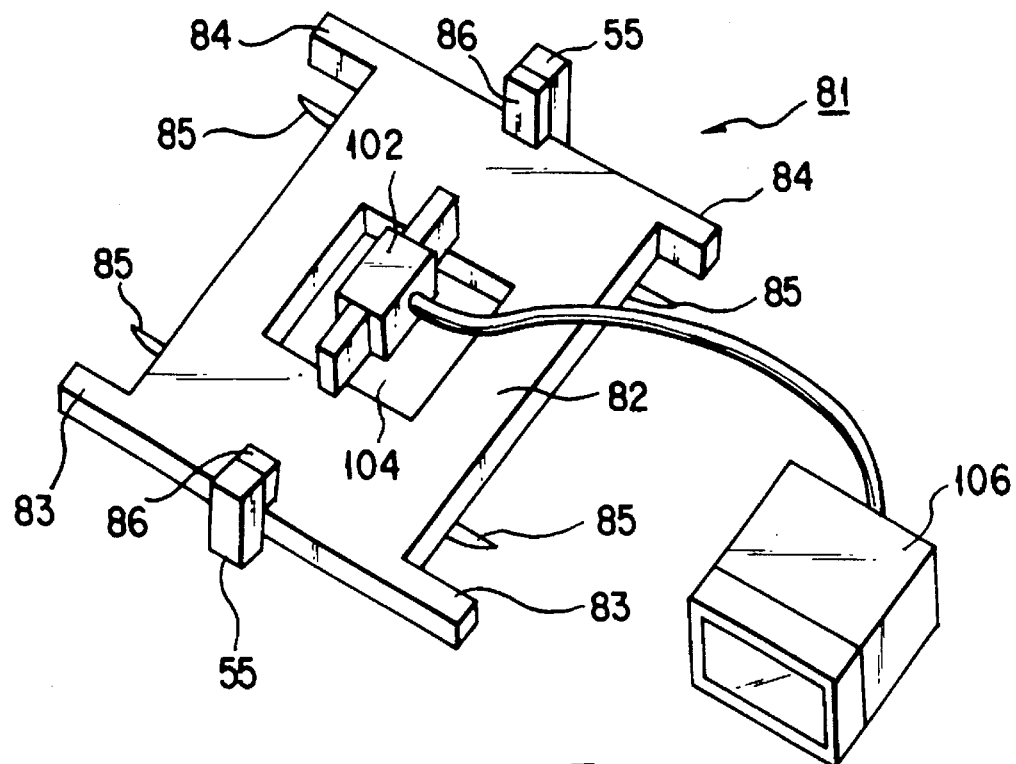
F I G. 17
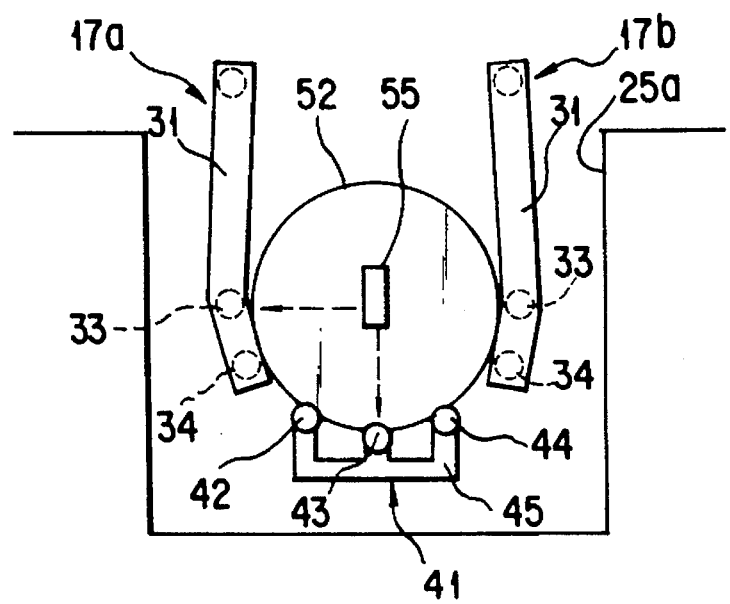
F I G. 18

SEMICONDUCTOR PROCESS SYSTEM AND POSITIONING METHOD AND APPARATUS FOR TRANSFER MECHANISM THEREOF

BACKGROUND OF THE INVENTION

1. Field of the Invention

The present invention relates to a semiconductor process system for processing substrates to be processed such as semiconductor wafers and LCD substrates and, more particularly, to an improvement in positioning for a transfer mechanism for substrates to be processed in a semiconductor process system.

2. Description of the Related Art

In a manufacturing process for a semiconductor device such as an LSI, cleaning systems are used to remove contaminants such as particles, organic contaminants, and metal impurities on a semiconductor wafer surface. Of these systems, a wet cleaning system is widely used because it can effectively remove particles and allows a batch process.

The wet cleaning system includes an input mechanism, a wafer convey robot, a plurality of process sections, and an output mechanism. The input mechanism receives a predetermined number of (e.g., 25) wafers stored in a cassette. The convey robot conveys a predetermined number of wafers received by the input mechanism, e.g., 50 wafers, at a time. The process sections are arranged to clean the wafers conveyed by the wafer convey robot all together. The output mechanism discharges the wafers cleaned by the process sections while the wafers are stored in cassettes.

The convey robot has a handler called a wafer chuck for grasping a predetermined number of wafers, e.g., 50 wafers, at once to convey them to the respective process sections. The wafer chuck has a pair of arms normally protruding in substantially the horizontal direction and opposing each other. A plurality of grooves corresponding to the number of wafers to be grasped are formed in these arms at predetermined intervals. Peripheral portions of wafers are inserted in these grooves. The two arms are then brought close to each other to grasp the wafers in a vertical position.

A holder called a boat for holding wafers conveyed by the wafer chuck, i.e., the handler, is arranged in the process vessel of each process section for cleaning wafers. The boat receives and holds the wafers grasped by the handler all together. For this purpose, the boat has a plurality of grooves corresponding to the grooves of the handler, and receives and holds peripheral portions of the wafers in the grooves in a vertical position.

When, therefore, wafers are transferred between the wafer chuck, i.e., the handler, and the boat, i.e., the holder, the grooves of the handler which are designed to determine the respective grasping positions must be located on the same perpendicular planes as those of the grooves of the holder which are designed to determine the respective holding positions. Otherwise wafers cannot be smoothly transferred. For this reason, positioning between the handler and the holder must be performed in advance. Since the holder is generally fixed in each process vessel, positioning is performed by properly adjusting/moving the handler in the X and Y directions.

In a conventional positioning method, a plurality of dummy wafers are grasped by the handler, and an operator manually adjusts the setting position of the handler properly while carefully observing the positional relationship between peripheral portions of the dummy wafers and corresponding grooves of the holder, thereby properly inserting the peripheral portions of the dummy wafers into the corresponding grooves of the holder in vertical states. This method, however, greatly depends on the skill of each operator, and the possibility of human error cannot be denied. That is, the method lacks reliability. In addition, the operator must check the actual state of transfer of wafers in each process vessel by directly looking into the vessel. For this reason, the working environment is poor, and it takes much time and labor to adjust the handler.

In another conventional positioning method, a position where the handler transfers wafers is accurately measured in advance to be determined as a reference position, and the position of the handler is detected by a distance sensor. The difference between the reference and detected positions of the handler is displayed in numerical values, thus detecting a positional offset. The setting position of the handler is properly adjusted to nullify the difference. In this method, however, an error tends to occur in actual measurement for determining the reference position of the handler. That is, similar to the above case of manual operation, the method lacks reliability. Furthermore, since the shape of the handler is not simple, distance sensors need to be set in a large number of places to detect the position of the handler. As a result, the positioning mechanism itself is complicated. In addition, since such sensors must be arranged in each process vessel, new problems are posed in terms of resistance to a cleaning solution and water tightness.

SUMMARY OF THE INVENTION

It is, therefore, an object of the present invention to perform relative positioning of a handler and a holder easily, quickly, and accurately.

According to the present invention, there is provided a positioning apparatus in a transfer mechanism of a semiconductor process system, the transfer mechanism including a handler having a plurality of support portions for supporting a plurality of substrates to be processed, and a holder having a plurality of holding portions for holding the plurality of substrates, the handler and the holder having a reference relative position set therebetween to transfer the substrates between the handler and the holder, and the positioning apparatus being adapted to correct an offset of a relative position between the handler and the holder from the reference relative position, comprising:

a frame member which can be supported by the handler;

means, engaged with the support portions, for positioning the frame member with respect to the handler;

first image pickup means arranged on the frame member, the first image pickup means being capable of simultaneously picking up images of first and second marks respectively arranged on the handler and the holder when the handler and the holder are located at the reference relative position, and the first and second marks respectively having substantially the same relative positions with respect to the support and holding portions; and first display means for displaying the images of the first and second marks picked up by the first image pickup means to be superposed on each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a view showing the inside of a modification of the image pickup section;

FIG. 16 is a perspective view showing a detection unit of a positioning apparatus according to still another embodiment of the present invention;

FIG. 17 is a perspective view showing a detection unit of a positioning apparatus according to still another embodiment of the present invention; and FIG. 18 is a front view showing another positioning method using the positioning apparatus shown in FIGS. 2 to 7.

DETAILED DESCRIPTION OF THE PREFERRED EMBODIMENTS

Figure 1:
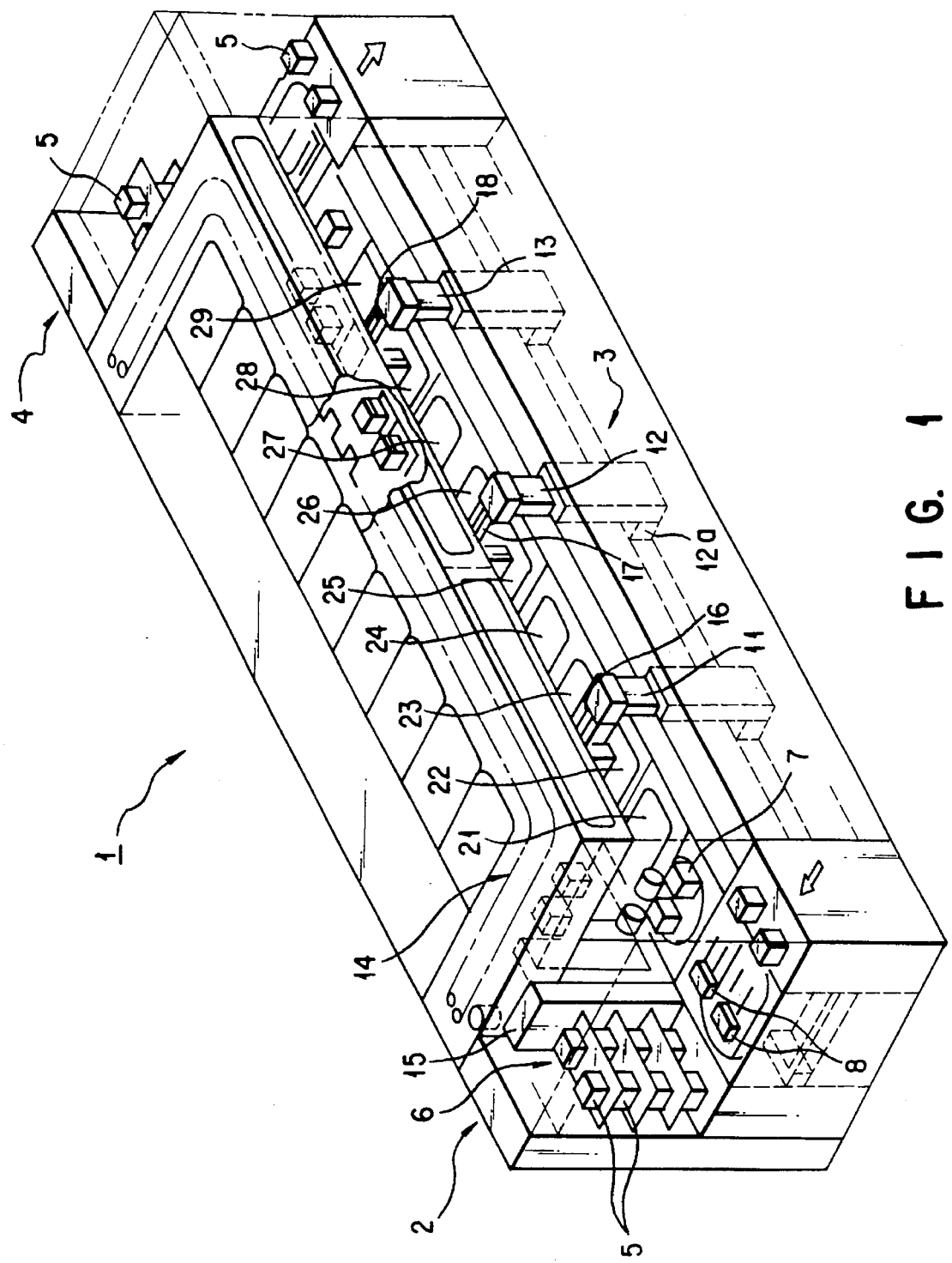
FIG. 1 is a perspective view showing a semiconductor wafer cleaning system using a positioning apparatus according to the present invention.

A positioning apparatus according to the present invention is used, for example, in a semiconductor wafer cleaning system shown in FIG. 1. As shown in FIG. 1, a cleaning system 1 is constituted by a total of three zones, i.e., an input unit 2, a cleaning unit 3, and an output unit 4.

A carrier convey device 8 is arranged in the input unit 2. The carrier convey device 8 conveys a wafer cassette 5 externally loaded by a convey robot or the like. A predetermined number of uncleaned wafers, e.g., 25 wafers, are stored in the wafer cassette 5. The wafer cassette 5 placed on the mount table of the input unit 2 is conveyed directly to the cleaning unit 3 or to a store section 6 by the carrier convey device 8, and is set in a standby state.

In the cleaning unit 3, a loader 7 is arranged to be adjacent to the input unit 2. For example, the loader 7 takes out wafers from the wafer cassette 5, performs orientation flat alignment, and detects the number of wafers. The wafer cassette 5 is conveyed from the store section 6 to the loader 7 by the carrier convey device 8. An unloader is also arranged in the cleaning unit 3 to be adjacent to the output unit 4. For example, the unloader loads wafers into the wafer cassette 5, performs orientation flat alignment, and detects the number of wafers. The wafer cassette 5 is conveyed from the unloader to the output unit 4 by a convey device arranged in the output unit 4.

In the cleaning unit 3, three wafer convey robots 11, 12, and 13 are arranged on the front side (the front side in FIG. 1). A cassette cleaning line 14 is arranged above the cleaning unit 3 to extend therealong. The cassette cleaning line 14 cleans and dries each empty cassette 5 from which wafers are taken out by the convey robot 11 on the upstream side. Cassettes are supplied to the cleaning line 14 by the loader 7 and a lifter 15.

A lifter (not shown) identical to the lifter 15 is also arranged on the output unit 4 side. An empty cassette from the cleaning line 14 is set at a predetermined position on the unloader on the output unit 4 side by this lifter.

In the cleaning unit 3, a plurality of process sections 21 to 29, each having a vessel made of, e.g., quartz, are arranged in a row. More specifically, the process sections 21 to 29 are: a chuck cleaning section 21, a first chemical cleaning section 22, water cleaning sections 23 and 24, a second chemical cleaning section 25, water cleaning sections 26 and 27, a chuck cleaning section 28, and a drying section 29, which are arranged in this order from the loader 7 side.

The chuck cleaning section 21 cleans and dries a wafer chuck 16 of the convey robot 11 on the upstream side. The first chemical cleaning section 22 cleans impurities such as organic contaminants, metal impurities, and particles from a wafer surface by using a chemical solution. The water cleaning sections 23 and 24 clean the wafers, which have been cleaned by the first chemical cleaning section 22, by using, e.g., pure water. The second chemical cleaning section 25 cleans wafers by using a chemical solution different from that used in the first chemical cleaning section 22. The water cleaning sections 26 and 27 clean wafers, which have been cleaned by the second chemical cleaning section 25, by using, e.g., pure water. The chuck cleaning section 28 cleans and dries a wafer chuck 18 of the convey robot 13 on the downstream side. The drying section 29 dries wafers, from which impurities have been removed, by evaporation using, e.g., IPA (isopropyl alcohol). In the chemical cleaning sections 22 and 25, the respective chemical solutions overflow and circulate. Upon being circulated, impurities accumulated in the respective cleaning solutions are removed.

The wafer convey robots 11, 12, and 13 basically have the same structure. Therefore, the convey robot 12 will be described as the representative with reference to FIGS. 1 to 4.

The convey robot 12 includes an elevating member 12b arranged on a base 12a which moves along the arranging direction (X direction) of the respective cleaning sections. The elevating member 12b has a column capable of moving in the vertical direction (Z direction). A chuck driving member 12d is mounted on the column. The chuck driving member 12d moves a chuck 17 in the longitudinal direction (Y direction) of each cleaning section and also rotates the chuck 17. The column of the elevating member 12b is covered with a bellows seal 12c. With this structure, the slidable contact portion of the elevating member 12b is protected against particles produced in the cleaning unit 3.

Figure 2:
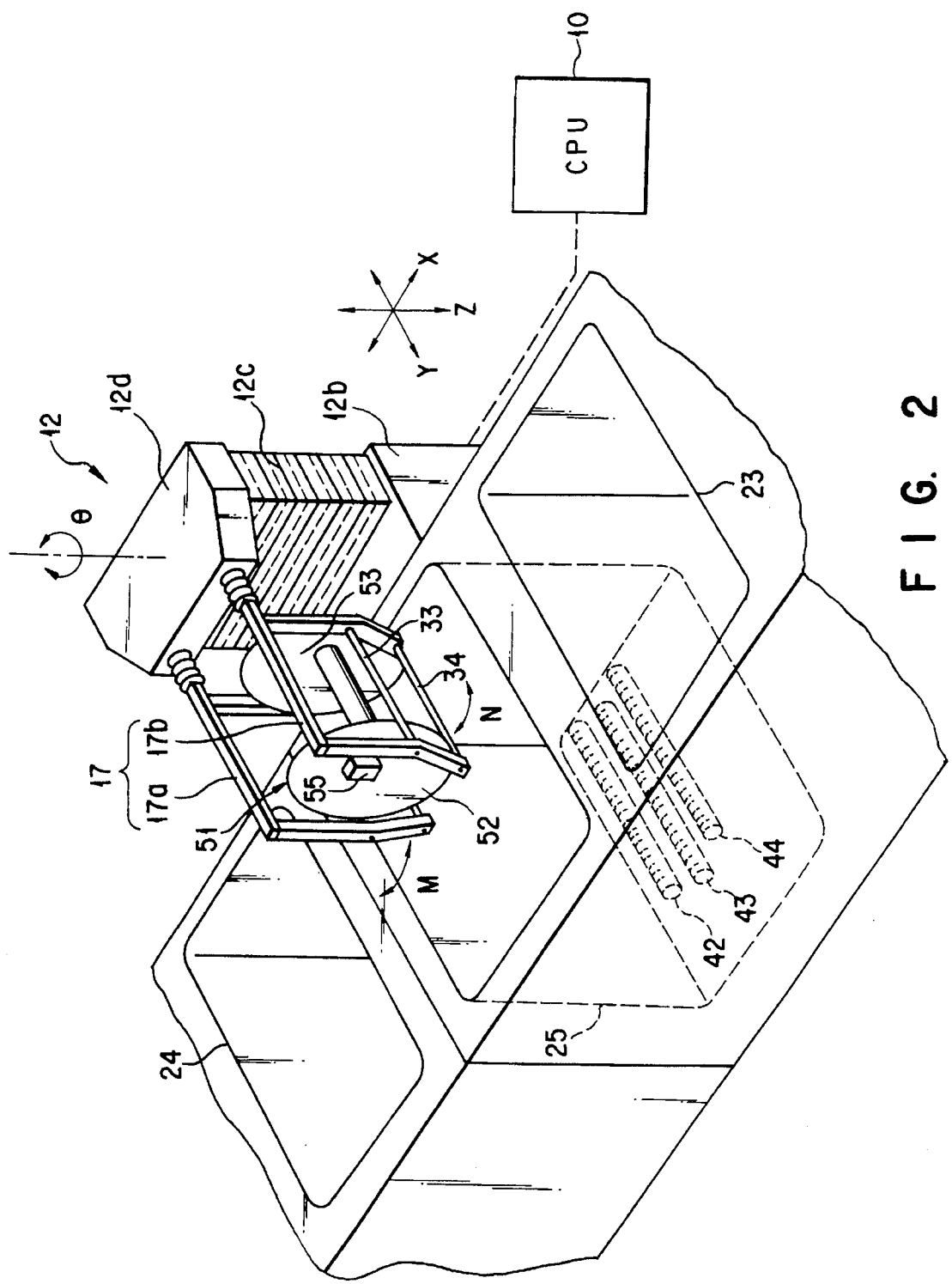
FIG. 2 is a perspective view showing a state wherein a detection unit of a positioning apparatus according to an embodiment of the present invention is mounted on a wafer chuck of the cleaning system shown in FIG. 1.
Figure 3:
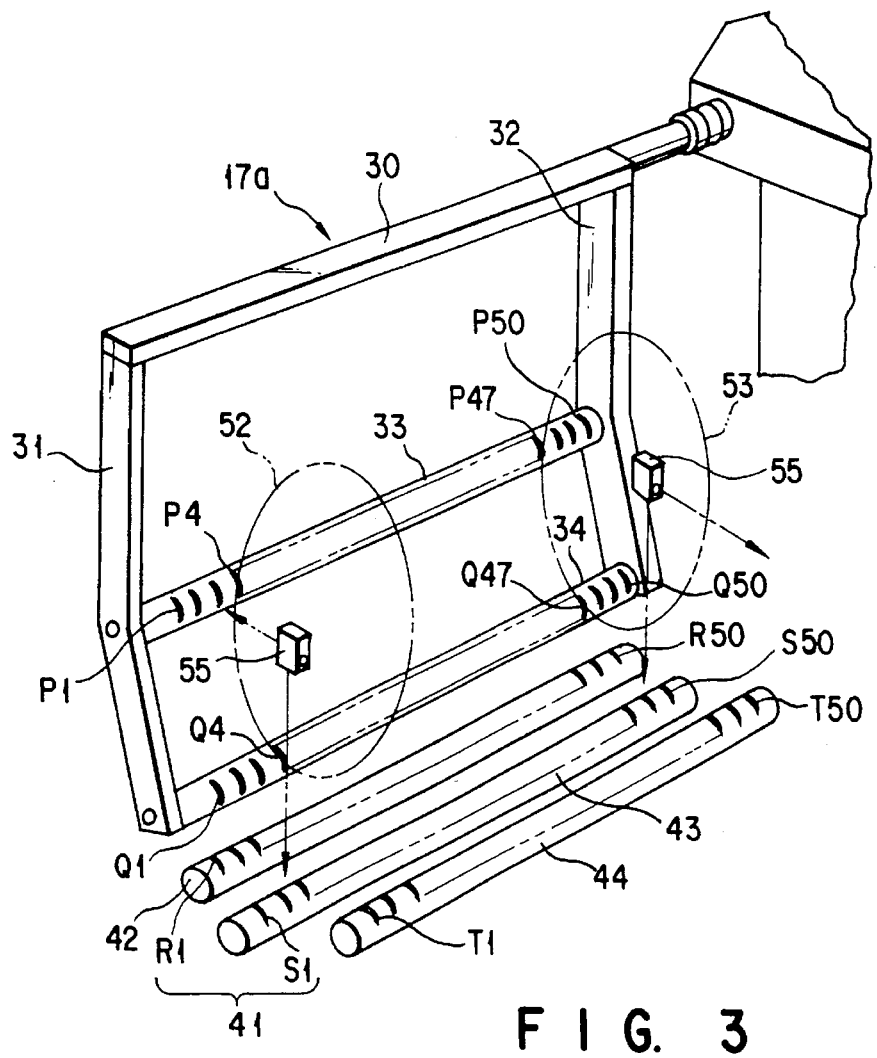
FIG. 3 is a perspective view showing the relationship between the wafer chuck and wafer holder of the cleaning system and the imaging directions of the detection unit of the positioning apparatus shown in FIG. 2.

The overall elevating member 12b can be slightly rotated about its vertical center within a horizontal plane so as to finely adjust the direction of the chuck 17 in the θ direction in FIG. 2. Changing of the setting positions of the chuck 17 in the X, Y, and Z directions, i.e., manual adjustment/movement for positioning to be described later, can be arbitrarily performed by controlling a pulse motor, and the set values are sequentially stored in a CPU 10.

The handler, i.e., the wafer chuck 17, includes a pair of arms 17a and 17b supported on the front surface of a driving member 12d to be pivotal (in the directions indicated by arrows M and N in FIG. 2). The arms 17a and 17b are symmetrical to each other. Each of the arms 17a and 17b includes a horizontal shaft rod 30 as an upper portion, vertical rods 31 and 32 extending downward from the two end portions of the shaft rod 30, and horizontal rods 33 and 34 extending between lower portions of the vertical rods 31 and 32. The proximal end portions of the shaft rods 30 of the arms 17a and 17b are pivotally supported on the driving member 12d.

A plurality of grooves $P_i$ and $Q_i$ (i is an integer) are formed in the surfaces of the horizontal rods 33 and 34 at predetermined intervals to grasp a plurality of wafers at once. Peripheral portions of the wafers are respectively inserted in grasping grooves P and Q, and the arms 17a and 17b are pivoted inward, i.e., closed. As a result, the wafers are grasped by the arms 17a and 17b. In this embodiment, 50 grooves $P_1$ to $P_{50}$ and 50 grooves $Q_1$ to $Q_{50}$ are formed in the horizontal rods 33 and 34, respectively, to grasp 50 wafers at once.

Wafer holders, each for holding a plurality of wafers, are respectively arranged in the process vessels, of the chemical cleaning sections 22 and 25 and the water cleaning sections 23, 24, 26, and 27. Each vessel serves to store a chemical solution or water. The relationships between the process vessels and the wafer holders in the respective cleaning sections are almost the same. Therefore, a boat, i.e., a wafer holder 41, arranged in a process vessel 25a of the chemical cleaning section 25 will be described below with reference to FIGS. 2 to 4.

The wafer holder 41 has three horizontal, parallel rods 42, 43, and 44 fixed near the bottom portion of the process vessel 25a via a bracket 45 to extend along the longitudinal direction (Y direction). Grooves $R_i$, $S_i$, and $T_i$ ( i is an integer) are respectively formed in the rods 42, 43, and 44 at the same intervals as those of the grooves Pi and Qi. In this embodiment, 50 grooves $R_1$ to $R_{50}$, 50 grooves $S_1$ to $S_{50}$, and 50 grooves $T_1$ and $T_{50}$ are formed in the rods 42, 43, and 44, respectively, to hold 50 wafers at once.

When wafers are to be cleaned by a chemical solution in the process vessel 25a, the robot 12 is moved along the X direction first, and the chuck 17 grasping the 50 wafers is located immediately above the process vessel 25a. Subsequently, the chuck 17 is lowered to be immersed in a chemical solution in the process vessel 25a. The chuck 17 is lowered to a transfer position where wafers are transferred between the chuck 17 and the holder 41.

At this transfer position, peripheral portions of each wafer grasped by the chuck 17 are received in the grooves $R_i$, $S_i$, and $T_i$ of the rods 41, 43, and 44 of the holder 41. Thereafter, the arms 17a and 17b of the chuck 17 are opened to move the wafers from the chuck 17 to the holder 41. The chuck 17 is moved upward and withdrawn from the process vessel 25a.

After the elapse of a predetermined immersing time, the chuck 17 is lowered to the wafer transfer position in the process vessel 25a while the arms 17a and 17b are kept open. Thereafter, the arms 17a and 17b are closed, such that peripheral portions of the 50 wafers held by the holder 41 are inserted in the grooves $P_i$ and $Q_i$ of the horizontal rods 33 and 34 of the arms 17a and 17b, thus grasping the wafers. Subsequently, the chuck 17 is raised, and the grasped wafers are conveyed to the next cleaning section, i.e., the water cleaning section 26.

Where the 50 wafers are transferred between the chuck 17 and the holder 41 all together in the above-described process, the grooves $P_1$ to $P_{50}$ and $Q_1$ to $Q_{50}$ of the chuck 17 and the grooves $R_1$ to $R_{50}$, $S_1$ to $S_{50}$, and $T_1$ to $T_{50}$ of the holder 41 must have correct relative positional relationships at the time of transfer of the wafers. For example, with regard to the groove $P_1$, the grooves $P_1$, $Q_1$, $R_1$, $S_1$, and $T_1$ must be located on the same plane.

Figure 5:
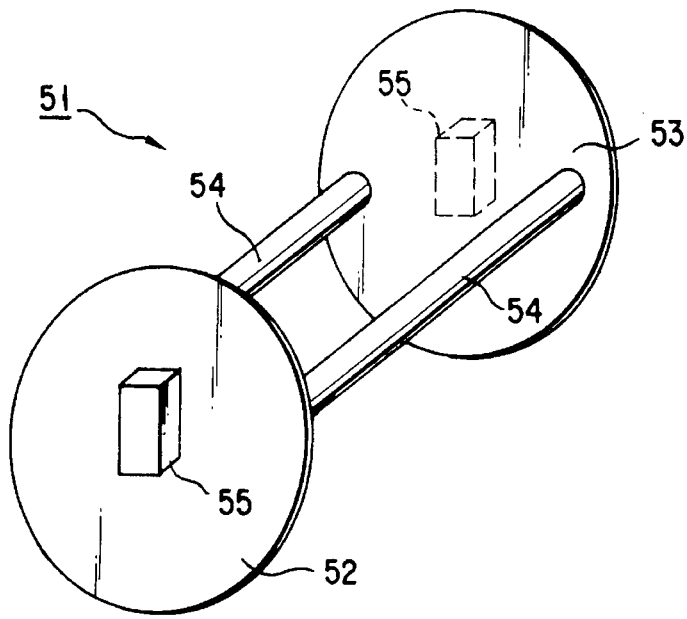
FIG. 5 is an enlarged perspective view showing the detection unit.

The positioning apparatus according to the present invention is used to detect the relative positional relationship between the grooves $P_i$ and $S_i$ and adjust the relative positional relationship between the chuck 17 and the holder 14 so as to position the five corresponding grooves $P_i$, $Qi$, $R_i$, $S_i$, and $T_i$ on the same plane. The positioning apparatus according to the embodiment of the present invention has a detection unit 51 shown in FIG. 5, which is mounted on the wafer chuck 17. The detection unit 51 is constituted by a pair of disk-like side plates 52 and 53 which have the same diameter and thickness as those of a wafer, and which are coupled to each other via two coupling rods 54 so as to be parallel and opposite to each other. The distance between the side plates 52 and 53 is set to be equal to the distance from the groove $P_4$ to the groove $P_{47}$.

Figure 6:
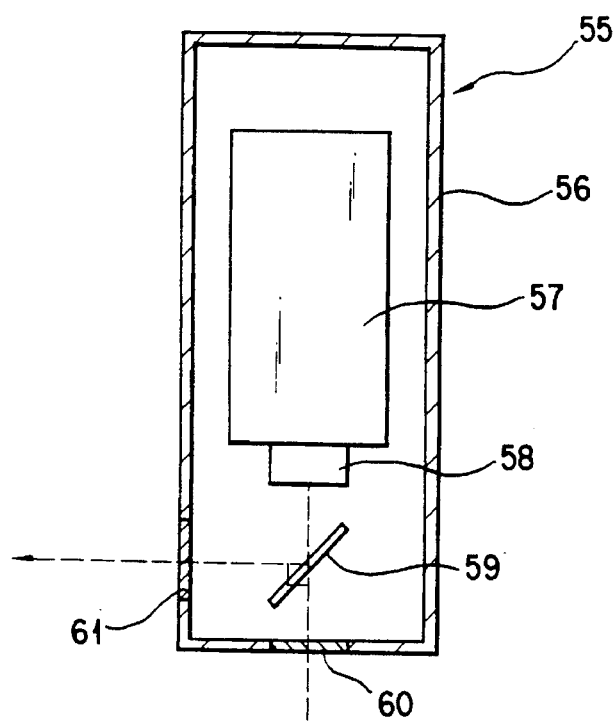
FIG. 6 is a view showing the inside of an image pickup section of the detection unit.

Image pickup sections 55 shown in FIG. 6 are arranged outside the side plates 52 and 53. The image pickup sections 55 respectively have substantially rectangular parallelepiped cases 56 fixed to the side plates 52 and 53. Image pickup cameras 57 are arranged in the cases 56 respectively. A magnifying lens 58 having a magnification of, e.g., ×20 is arranged in each camera 57. The lenses 58 are focused on peripheral portions of the side plates 52 and 53, respectively. Half mirrors 59 inclined at 45° are arranged immediately below the magnifying lenses 58. The half mirrors 59 are set to be located in the centers of the side plates 52 and 53, respectively.

View ports 60 and 61 covered with, e.g., acrylic plates are formed in the bottom and left side surfaces of each case 56.

The cameras 57 can magnify objects, located immediately below and in the horizontal direction with respect to the side plates 52 and 53, at ×20, and can simultaneously image the objects via the view ports 60 and 61.

Figure 7:
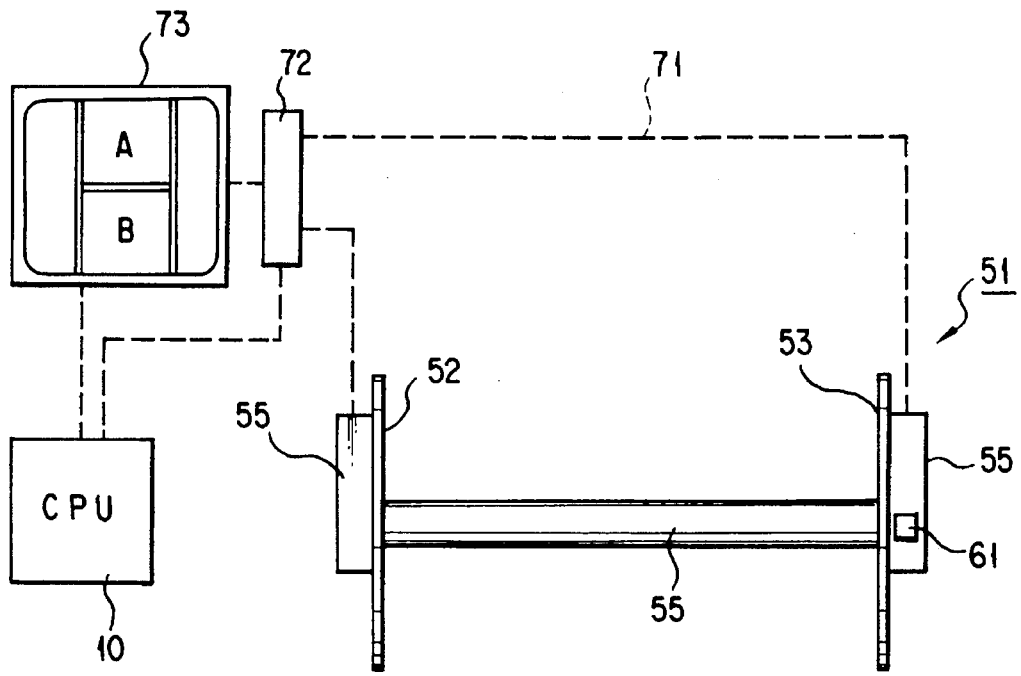
FIG. 7 is a block diagram showing the relationship between the detection unit and a monitor in the positioning apparatus.

As shown in FIG. 7, image signals from the cameras 57 of the image pickup sections 55 arranged on the side plates 52 and 53 are input to a mixer 72, arranged outside the cleaning system 1, via signal lines 71 such as cables or optical fibers. The mixer 72 has an image processing function. The processed image signals are then input to a monitor 73. The monitor 73 displays the images, obtained by the image pickup section 55 on the side plate 52, on an upper portion (portion A) of the screen; and the images, obtained by the image pickup section 55 on the side plate 53, on a lower portion (portion B) of the screen.

A method of using the positioning apparatus of the above embodiment will be described next.

As shown in FIG. 2, the detection unit 51 is used while it is grasped by the chuck 17. As described above, the side plates 52 and 53 of the detection unit 51 are constituted by disks each having the same diameter and thickness as those of a wafer as a substrate to be processed. In addition, as described above, the distance between the side plates 52 and 53 is set to be equal to the distance from the groove $P_4$ to $P_{47}$. Therefore, the chuck 17 can be caused to grasp the detection unit 51 by inserting peripheral portions of the side plates 52 and 53 into the grooves $P_4$ and $Q_4$ and into the grooves $P_{47}$ and $Q_{47}$, respectively, and closing the chuck 17.

Figure 8:
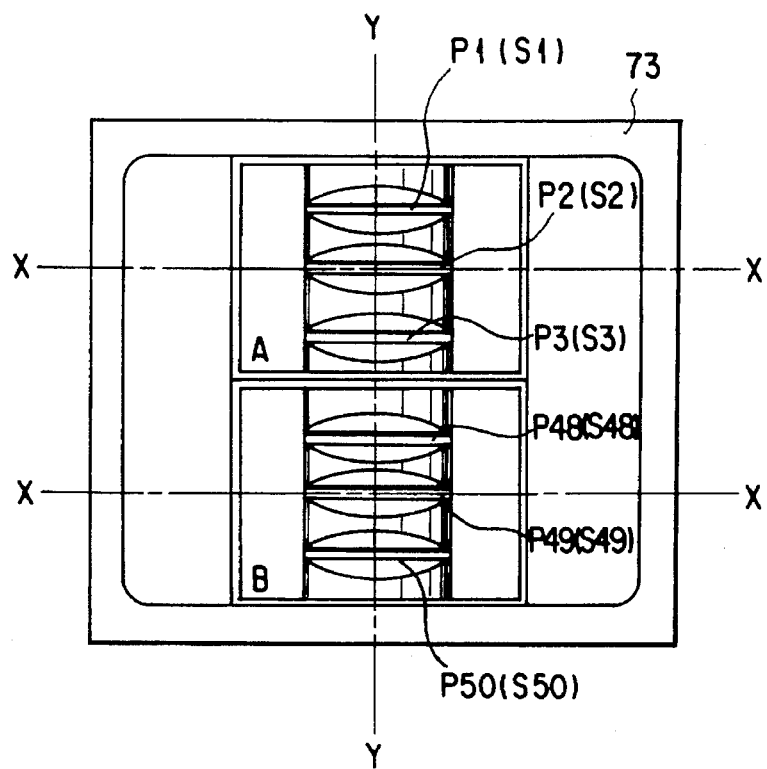
FIG. 8 is a view showing images of grooves of the wafer chuck which are displayed on the monitor of the positioning apparatus.

As shown in FIG. 8, when the monitor 73 is operated while the detection unit 51 is grasped by the chuck 17, enlarged images of the grooves $P_1$, $P_2$, and $P_3$ of the arm 17a are displayed on the upper portion (portion A) of the screen; and enlarged images of the grooves $P_{48}$, $P_{49}$, and $P_{50}$ of the arm 17b, on the lower portion (portion B) of the screen.

Figure 4:
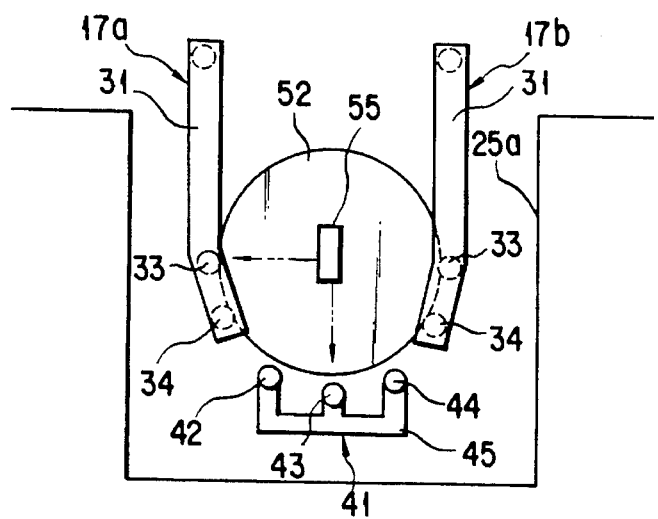
FIG. 4 is a front view showing the relationship in FIG. 3.

Subsequently, the chuck 17 is lowered into the process vessel 25a while the detection unit 51 is grasped by the chuck 17, and is stopped slightly before the position where wafers are received by the holder 41, as shown in FIG. 4. In this state, enlarged images of the grooves $S_1$, $S_2$, and $S_3$ are displayed on the upper portion (portion A) of the screen of the monitor 73, whereas enlarged images of the grooves $S_{48}$, $S_{49}$, and $S_{50}$ are displayed on the lower portion (portion B) of the screen. These enlarged images are displayed on the same coordinate systems (the X and Y axes in FIG. 8) as those of the enlarged images of the grooves $P_1$, $P_2$, and $P_3$ and of the grooves $P_{48}$, $P_{49}$, and $P_{50}$ at the same magnification as that thereof and are superposed thereon.

Figure 9:
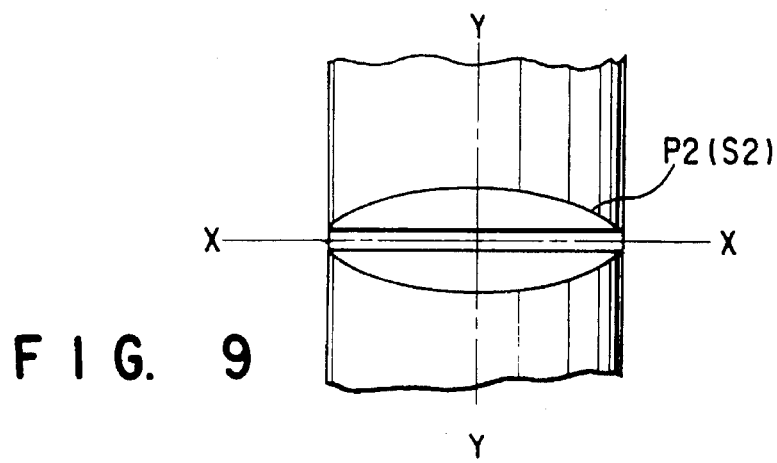
FIG. 9 is a view showing a state wherein when the wafer chuck and the holder are in a correct relative positional relationship, images of grooves of the two members, displayed on the monitor of the positioning apparatus, are perfectly superposed on each other.

If, therefore, the grooves $P_1$, $P_2$, and $P_3$ and the grooves $P_{48}$, $P_{49}$, and $P_{50}$ are located on the same perpendicular planes as those of the grooves $S_1$, $S_2$, and $S_3$ and the grooves $S_{48}$, $S_{49}$, and $S_{50}$, respectively, the enlarged images of the respective grooves coincide with each other on the screen, as shown in FIGS. 8 and 9. That is, it can be confirmed that the relative positional relationship between the chuck 17 and the holder 41 is a correct positional relationship for transfer of wafers.

If, however, the relative positional relationship between the chuck 17 and the holder 41 is offset from the correct positional relationship for transfer of wafers in the X, Y, and θ directions, the images of the grooves $P_i$ displayed on the screen of the monitor 73 are offset from the images of the grooves Si. Therefore, the operator can confirm the offset of the relative positional relationship between the chuck 17 and the holder 41.

Figure 10:
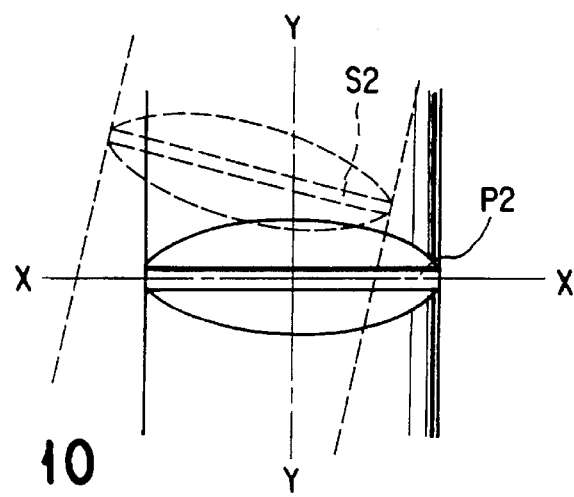
FIG. 10 is a view showing a state wherein when the wafer chuck and the holder are in an improper relative positional relationship, images of grooves of the two members, displayed on the monitor of the positioning apparatus, are superposed on each other with offsets from each other in the θ, X, and Y directions.
Figure 11:
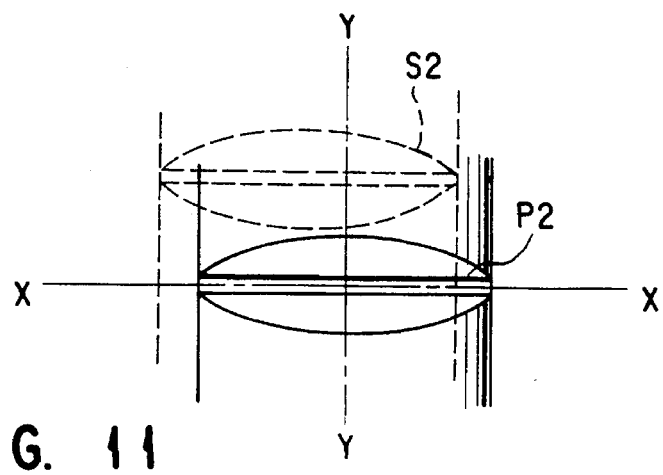
FIG. 11 is a view showing a state wherein when the wafer chuck and the holder are in an improper relative positional relationship, images of grooves of the two members, displayed on the monitor of the positioning apparatus, are superposed on each other with offsets from each other in the X and Y directions.

If, for example, an offset like the one shown in FIG. 10 is confirmed, the holder 41 is moved in the θ direction together with the process vessel to correct the offset in the θ direction, as shown in FIG. 11. After the adjustment in the θ direction is completed to set the state shown in FIG. 11, the X- and Y-direction driving systems of the convey robot 12 are operated to adjust the position of the chuck 17. With this operation, for example, the images of the grooves $P_2$ and $S_2$ are aligned with each other, as shown in FIG. 9.

The operator can perform the above adjusting operations in the θ, X, and Y directions while watching the monitor 73. Since the enlarged images of the grooves $P_1$, $P_2$, $P_3$, $S_1$, $S_2$, $S_3$, $P_{48}$, $P_{49}$, $P_{50}$, $S_{48}$, $S_{49}$, and $S_{50}$ are displayed on the monitor 73, visual recognition of the grooves can be easily performed. In addition, coincidence between the images can be easily confirmed. Therefore, the chuck 17 and the holder 41 can be easily and quickly positioned. Note that the horizontal rod 33 of each of the arms 17a and 17b may have a shape and a color different from those of the rod 43 of the holder 41 to further facilitate image recognition.

In addition, images of the grooves $P_i$ at the two end portions of the chuck 17 and those of the grooves $S_i$ at the two end portions of the holder 41, obtained by the two image pickup section 55, are displayed on the monitor 73. Therefore, a position offset at the two end portions of each member can be detected and corrected, allowing very accurate positioning. With regard to this point, it is preferable that the image pickup sections 55 be minimized in size, and at least two pairs of grooves nearest to the end portions, i.e., the grooves $P_1$ and $S_1$, and $P_{50}$ and $S_{50}$, be objects to be imaged. As in the embodiment shown in the accompanying drawings, imaging of different chuck arms 17a and 17b by means of the two image pickup section 55 is also effective in performing accurate positioning.

According to the above embodiment, the offsets of the relative positional relationship between the chuck 17 and the holder 41 from the correct positional relationship for transfer of wafers in the θ, X, and Y directions can be checked on the screen of the monitor 73. Since the relative positional relationship is corrected by referring to the offsets, positioning can be easily, quickly, and reliably performed. In addition, the detection unfit 51 can be easily mounted on the chuck 17. Furthermore, the structure of the positioning apparatus itself is simple.

The relative position between the chuck 17 and the holder 41 can be automatically adjusted, instead of being manually adjusted by the operator. In this case, signals from the image pickup sections 55 are input not only to the mixer 72 and the monitor 73 but also to the CPU 10 for controlling the overall cleaning system 1 including the wafer convey robots 11, 12, and 13, as shown in FIG. 7. The CPU 10 compares images of the grooves P and S, and controls/drives the chuck 17 and the holder 41, if necessary, to correct the offset between the two images, thereby automatically adjusting the relative position between the two members.

A detection unit 81 of a positioning apparatus according to another embodiment of the present invention will be described next with reference to FIG. 12 which is a perspective view of the detection unit 81.

The detection unit 81 has protruding portions 83 and 84 horizontally protruding from the two longitudinal end portions of a base 82 in the lateral direction. The longitudinal dimension of the base 82 is set to be equal to the distance from a groove $P_4$ to a groove $P_{47}$ of a chuck 17. Pawl portions 85, each having a shape conforming to a groove P, are arranged on the lower surface of the base 82 at, for example, four positions. Each pawl portion 85 horizontally extends outward. The distance between the two pawl portions 85 along the longitudinal direction of the base 82 is set to be n times the distance between the adjacent two grooves P of the chuck 17.

The image pickup sections 55 used in the above-described detection unit 51 are fixed at the middle positions of the two end faces of the base 82 via attachments 86. The view port 61 in a side surface of each image pickup section 55 is set at the same level as that of the pawl portion 85. The weight of the overall detection unit 81 is set, to be substantially equal to or smaller than the total weight of 50 wafers.

When positioning is to be performed by using the detection unit 81, the detection unit 81 is mounted on the chuck 17 first, as in the case of the detection unit 51. However, the detection unit 81 is arranged in the chuck 17 in the state shown in FIGS. 13 and 14, unlike the detection unit 51. More specifically, while arms 17a and 17b of the chuck 17 are closed, the protruding portions 83 and 84 of the base 82 are placed on horizontal rods 33 of the arms 17a and 17b such that the pawl portions 85 are inserted into the corresponding grooves P of the arms 17a and 17b.

Insertion of the pawl portions 85 into the grooves P is performed to simply position the detection unit 81, when setting it in the chuck 17. Since the overall detection unit 81 is supported by the horizontal rods 33 via the protruding portions 83 and 84, almost no load is applied to each groove P because of the weight of the detection unit 81. Therefore, each groove P is free from damage. In addition, the detection unit 81 is set in the chuck 17 in a very stable state. For this reason, the detection unit 81 can obtain more stable images than the detection unit 51.

Instead of imaging the grooves P of the chuck 17 and of grooves Q of a holder 41, proper marks formed on the two members in advance may be imaged, and the resultant images may be used as information for adjustment of the relative position between the two members. In this case, the positional relationship between the grooves P on the chuck 17 and the chuck-side marks is set to be substantially the same as that between the grooves Q on the holder 41 and the holder-side marks.

In each image pickup section 55, the lens 58 may be omitted, and magnifying lenses may be arranged in the view ports 60 and 61. In addition, as shown in FIG. 15, a right-angle prism 91 may be used in place of the half mirror 59. Even with the prism 91, an optical path extending from the camera 57 can be split into two paths to simultaneously image objects located in two directions. In addition, by changing the shape of the prism or combining another optical element with the prism, an optical path extending from the camera 57 can be split into two optical paths extending to two objects located at an interval of an angle other than a right angle. That is, by properly splitting an optical path extending from the camera 57, positioning between the chuck 17 and the holder 41 may be performed by using, for example, grooves Q of the horizontal rod 34 and grooves S of the holder 41.

Furthermore, as shown in FIG. 16, the grooves P and Q can be imaged by two cameras 95 and 96. By mixing signals from the two cameras 95 and 96 and superposing them on the monitor, the same functions as those in the above two embodiments can be obtained.

Figure 12:
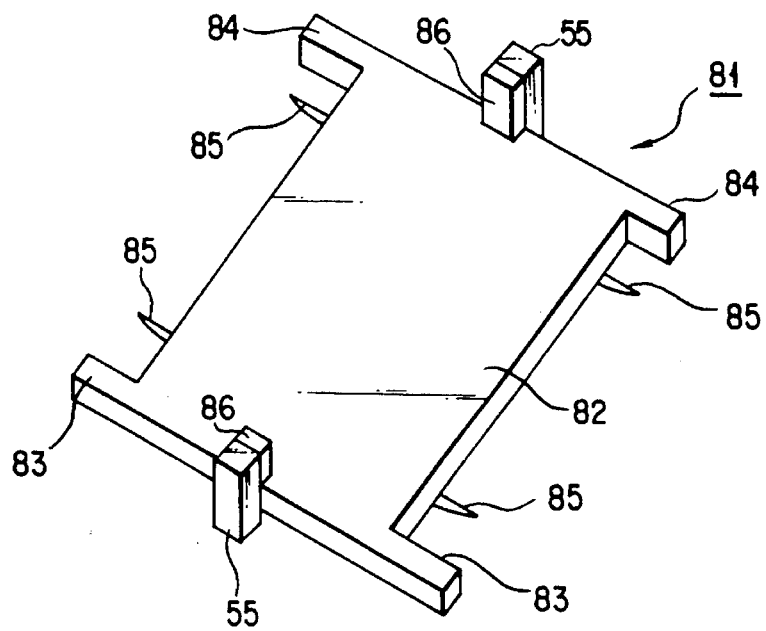
FIG. 12 is a perspective view showing a detection unit of a positioning apparatus according to another embodiment of the present invention.
Figure 13:
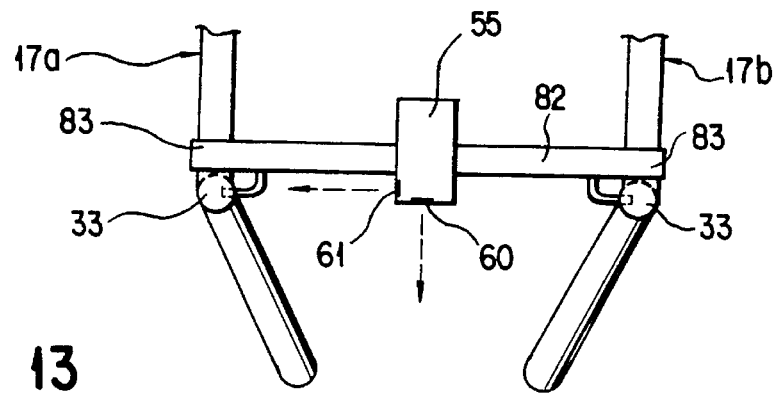
FIG. 13 is a front view of a portion of the detection unit, showing a state wherein the detection unit is mounted on a wafer chuck.
Figure 14:
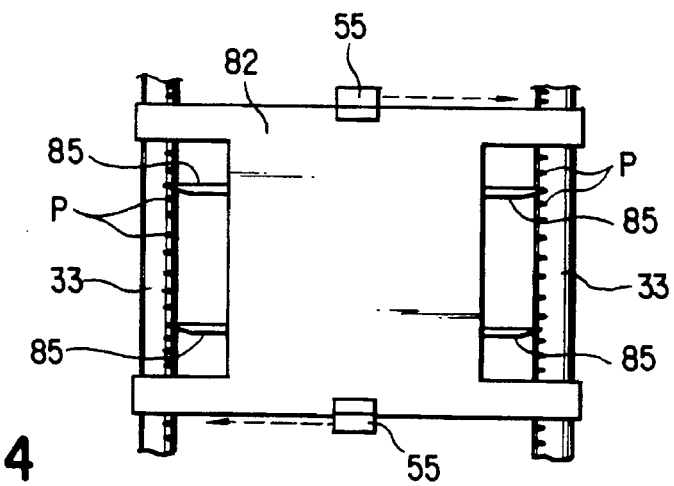
FIG. 14 is a plan view showing the state in FIG. 13.

FIG. 17 shows the detection unit 81 in FIGS. 12 to 14, to which a distance sensor 102 is added. An opening 104 is formed in the center of a base 82, and the distance sensor 102 is arranged in the opening 104 to face downward. The sensor 102 is a known sensor having a light-emitting element and a light-receiving element. Light from the light-emitting element is irradiated on an object, and light reflected by the object is received by the light-receiving element, thereby detecting the distance between the sensor 102 and the object. The distance measured by the sensor 102 is displayed on a monitor 106.

According to the embodiment shown in FIG. 17, since the position of the detection unit 81 with respect to the holder 41 can always be measured, a positioning operation is further facilitated. In measuring the distance between a holder 41 and the detection unit 81, a portion of a central rod 43 of the holder 41 may be set as an object to be measured, or a reflecting plate may be mounted between rods 42 and 44 on the two sides of the holder 41 to be set as an object to be measured by the sensor 102.

The detection units 51 and 81 of the positioning apparatus may be mounted on the holder 41 instead of the chuck 17. In this case, as shown in FIG. 18, first of all, the detection unit 51 is mounted on the holder 41 and is positioned such that the side plate 52 is inserted into the grooves $R_4$, $S_4$, and $T_4$ of the holder 41, and the side plate 53 is inserted into the grooves $R_{47}$, $S_{47}$, and $T_{47}$ of the holder 41. When the monitor 73 (FIGS. 7 and 8) is operated in this state, enlarged views of the grooves $S_1$, $S_2$, and $S_3$ of the central rod 43 are displayed on the upper portion of the screen of the monitor 73, and enlarged views of the grooves $S_{48}$, $S_{49}$, and $S_{50}$ of the rod 43 are displayed on the lower portion of the screen.

The chuck 17 in a slightly open state is then lowered into the process vessel 25a and is positioned such that the horizontal rods 33 of the chuck arms 17a and 17b are set in the field of the view of each image pickup section 55 of the detection unit 51. In this state, enlarged views of the grooves $P_1$, $P_2$, and $P_3$ of the arm 17a are displayed on the upper portion of the screen of the monitor 73 while being superposed on the enlarged views of the grooves $S_1$, $S_2$, and $S_3$, respectively. At the same time, enlarged views of the grooves $P_{48}$, $P_{49}$, and $P_{50}$ of the arm 17b are displayed on the lower portion of the screen while being superposed on the enlarged views of the grooves $S_{48}$, $S_{49}$, and $S_{50}$. Therefore, positioning of the chuck 17 and the holder 41 can be performed by moving the chuck 17 or the holder 41 by the same method as described above.

In each of the embodiments described above, the present invention is applied to the wafer transfer mechanism between the chuck and the holder in each process vessel in the wafer cleaning system. However, the present invention is not limited to this and can be applied to correction of the relative position between a handler and a holder, which transfer substrates (to be processed) therebetween in various semiconductor process system.

Additional advantages and modifications will readily occur to hose skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A positioning apparatus in a transfer mechanism of a semiconductor process system, said transfer mechanism including a handler having a plurality of support portions for supporting a plurality of substrates to be processed, and a holder having a plurality of holding portions for holding the plurality of substrates, said handler and said holder having a reference relative position set therebetween to transfer the substrates between said handler and said holder, and said positioning apparatus being adapted to correct an offset of a relative position between said handler and said holder from the reference relative position, comprising:

a frame member which can be supported by one of said handler and said holder;

means, engaged with said support portions or said holding potions of said one of said handler and said holder, for positioning said frame member with respect to said one of said handler and said holder;

first image pickup means arranged on said frame member, said first image pickup means being capable of simultaneously picking up images of first and second marks respectively arranged on said handler and said holder when said handler and said holder are located at the reference relative position, and said first and second marks respectively having the same relative positions with respect to said support and holding portions; and first display means for displaying the images of said first and second marks picked up said first image pickup means to be superposed on each other.

2. An apparatus according to claim 1, wherein said first and second marks respectively comprise a first support portion of said support portions, and a first holding portion of said holding portions, said first support and holding portions being adapted to be engaged with a first substrate of the substrates to be processed.

3. An apparatus according to claim 1, wherein said first image pickup means comprises a camera and an optical element for splitting an optical path extending from said camera into optical paths extending to said first and second marks.

4. An apparatus according to claim 3, wherein said optical element is a half mirror.

5. An apparatus according to claim 3, wherein said optical element is a prism.

6. An apparatus according to claim 3, wherein the optical path extending from said camera is split into optical paths defining an angle of 90°.

7. An apparatus according to claim 1, further comprising:

second image pickup means arranged on said frame member, said second image pickup means being capable of simultaneously picking up images of third and fourth marks respectively arranged on said handler and said holder when said handler and said holder are located at the reference relative position, and said third and fourth marks respectively having the same relative positions with respect to said support and holding portions; and second display means for displaying the images of said third and fourth marks picked up by said second image pickup means to be superposed on each other.

8. An apparatus according to claim 7, wherein said first and second display means commonly comprise one display.

9. An apparatus according to claim 7, wherein said handler comprises a pair of opening/closing arms, said first image pickup means images said first mark on one of said arms and said second image pickup means images said mark on the other arm.

10. An apparatus according to claim 7, wherein said first and second marks respectively comprise a first support portion of said support portions, and a first holding portion of said holding portions, said first support and holding portions being adapted to be engaged with a first substrate of the substrates to be processed, and said third and fourth marks respectively comprise a second support portion of said support portions, and a second holding portion of said holding portions, said second support and holding portions being adapted to be engaged with a second substrate of the substrates to be processed.

11. An apparatus according to claim 10, wherein the first and second substrates are located near two ends of the plurality of substrates.

12. A positioning method using a positioning apparatus in a transfer mechanism of a semiconductor process system, said transfer mechanism including a handler having a plurality of support portions for supporting a plurality of substrates to be processed, and a holder having a plurality of holding portions for holding the plurality of substrates, said handler and said holder having a reference relative position set therebetween to transfer the substrates between said handler and said holder, and said positioning apparatus being adapted to correct an offset of a relative position between said handler and said holder from the reference relative position, said positioning apparatus including a frame member which can be supported by one of said handler and said holder;

means, engaged with said support portions or said holding portions of said one of said handler and said holder, for positioning said frame member with respect to said one of said handler and said holder;

first image pickup means arranged on said frame member, said first image pickup means being capable of simultaneously picking up images of first and second marks respectively arranged on said handler and said holder when said handler and said holder are located at the reference relative position, and said first and second marks respectively having the same relative positions with respect to said support and holding portions, and first display means for displaying the images of said first and second marks picked up by said first image pickup means to be superposed on each other, the method comprising the steps of:

mounting and positioning said frame member on one of said handler and said holder;

bringing said handler close to said holder to substantially meet the reference relative position;

picking up the images of said first and second marks by using said first image pickup means, and displaying the images on said first display means to be superposed on each other; and relatively moving said handler and said holder to correct an offset between the images of said first and second marks picked up by said first image pickup means, thereby correcting an offset of a current relative position between said handler and said holder from the reference relative position.

13. A method according to claim 12, wherein the offset of the current relative position between said handler and said holder is corrected by referring to the images of said first and second marks displayed on said first display means.

14. A method according to claim 12, wherein the offset of the current relative position includes offset components in X, Y, and θ directions, the offset components in the X and Y directions are corrected by moving only said handler, and the offset component in the θ direction is corrected by moving only said holder.

15. A method according to claim 12, wherein said first and second marks respectively comprise a first support portion of said support portions, and a first holding portion of said holding portions, said first support and holding portions being adapted to be engaged with a first substrate of the substrates to be processed.

16. A method according to claim 12, wherein said positioning apparatus further comprises second image pickup means arranged on said frame member, said second image pickup means being capable of simultaneously picking up images of third and fourth marks respectively arranged on said handler and said holder when said handler and said holder are located at the reference relative position, and said third and fourth marks respectively having the same relative positions with respect to said support and holding portions, and second display means for displaying the images of said third and fourth marks picked up by said second image pickup means to be superposed on each other, and the method comprises the step of relatively moving said handler and said holder to correct an offset between the images of said third and fourth marks picked up by said second image pickup means, thereby correcting an offset of a current relative position between said handler and said holder from the reference relative position.

17. A method according to claim 16, wherein said first and second display means commonly comprise one display.

18. A method according to claim 16, wherein said handler comprises a pair of opening/closing arms, said first image pickup means images said first mark on one of said arms, and said second image pickup means images said mark on the other arm.

19. A method according to claim 16, wherein said first and second marks respectively comprise a first support portions of said support portions, and a first holding portion of said holding portions, said first support and holding portions being adapted to be engaged with a first substrate of the substrates to be processed, and said third and fourth marks respectively comprise a second support portions of said support portions, and a second holding portion of said holding portions, said second support and holding portions being adapted to be engaged with a second substrate of the substrates to be processed.

20. An apparatus according to claim 19, wherein the first and second substrates are located near two ends of the plurality of substrates.

21. A semiconductor process system comprising:

(a) a process section for processing a plurality of substrates to be processed at once, said process section including a holder having a plurality of holding portions for holding the substrates;

(b) a handler driven to pass/receive the substrates to/from said holder, said handler having a plurality of support portions for supporting the substrates, said handler and said holder having a reference relative position set therebetween for transfer of the substrates between said handler and said holder; and (c) a positioning apparatus for correcting an offset of a relative position between said handler and said holder from the reference relative position, said positioning apparatus including a frame member which can be supported by one of said handler and said holder;

means, engaged with said support portions or said holding potions of said one of said handler and said holder, for positioning said frame member with respect to said one of said handler and said holder;

first image pickup means arranged on said frame member, said first image pickup means being capable of simultaneously picking up images of first and second marks respectively arranged on said handler and said holder when said handler and said holder are located at the reference relative position, and said first and second marks respectively having substantially the same relative positions with respect to said support and holding portions, and first display means for displaying the images of said first and second marks picked up by said first image pickup means to be superposed on each other.

* * * * *